US010541679B1

(12) United States Patent
Liu et al.

(10) Patent No.: US 10,541,679 B1
(45) Date of Patent: Jan. 21, 2020

(54) PULSE AMPLIFIER (71) Applicant: AVAGO TECHNOLOGIES INTERNATIONAL SALES PTE. LIMITED, Singapore (SG)

(72) Inventors: Yong Liu, Irvine, CA (US); Chang Liu, Irvine, CA (US); Delong Cui, Tustin, CA (US); Jun Cao, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 16/170,068

(22) Filed: Oct. 25, 2018

(51) Int. Cl.
*H03K 3/356* (2006.01)
*H03K 17/082* (2006.01)

(52) U.S. Cl.
CPC ... *H03K 3/356113* (2013.01); *H03K 17/0822* (2013.01)

(58) Field of Classification Search
CPC .......... H03K 17/00; H03K 17/04126; H03K 17/063; H03K 17/0822; H03K 17/0826; H03K 17/601; H03K 2217/00; H03K 2217/0036; H03K 3/00; H03K 3/356113
USPC ....................................................... 327/109
See application file for complete search history.

(56) References Cited

U.S. PATENT DOCUMENTS

| 2004/0042305 | A1* | 3/2004 | Joo | .......................... | G11C 7/06 365/205 |
| 2006/0103451 | A1* | 5/2006 | Lim | ....................... | G05F 1/575 327/540 |
| 2011/0025380 | A1* | 2/2011 | Kim | ................. | H03K 3/356113 327/108 |

OTHER PUBLICATIONS

Ali Mesgarani, et al, "Supply Boosting Technique for Designing Very Low-Voltage Mixed-Signal Circuits in Standard CMOS," IEEE International Midwest Symposium on Circuits and Systems, pp. 12-15, Aug. 2010.
Behzard Razavi, "The Bootstrapped Switch," IEEE Solid-State Circuits Magazine, pp. 12-15, Summer 2015.

\* cited by examiner

*Primary Examiner* — Lincoln D Donovan
*Assistant Examiner* — Dave Mattison
(74) *Attorney, Agent, or Firm* — Foley & Lardner LLP (57) ABSTRACT

Various aspects of amplifying amplitude of a pulse are disclosed herein. In sonic embodiments, a device includes driver circuitry that receives an input pulse swinging or transitioning between a first reference voltage and a second reference voltage higher than the first reference voltage, In some embodiments, the driver circuitry generates a driving pulse swinging between a third reference voltage and the second reference voltage according to the input pulse, where the third reference voltage is between the first reference voltage and the second reference voltage. In some embodiments, the device further includes a transistor coupled to the driver circuitry. In some embodiments, the transistor outputs an output pulse swinging between the first reference voltage and an output voltage according to the driving pulse from the driver circuitry, where the output voltage is higher than the second reference voltage.

20 Claims, 7 Drawing Sheets

PULSE AMPLIFIER

FIELD OF THE DISCLOSURE

This disclosure generally relates to systems and methods for amplifying amplitude of an electrical pulse applied to an electrical device.

BACKGROUND OF THE DISCLOSURE

Electrical devices employ an electrical signal having one or more pulses for operations. In one example, an electrical signal swings or transitions between a first state (e.g., ground voltage or 0V) and a second state (e.g., supply voltage or VDD). According to states of the electrical pulses, electrical devices perform various operations. For example, a sampling circuit enables sampling while the electrical signal is in the second state, or when the electrical signal transitions from one of the first state and the second state to the other of the first state and the second state.

In one application, increased amplitude of a pulse enables an improved performance of an electrical device. For example, increasing amplitude of a clock signal applied to a sampling circuit enhances linearity or efficiency of sampling performed. For another example, increasing amplitude of a carrier signal applied to a modulator (e.g., up-converter or down-converter) improves linearity or efficiency of modulation performed. However, an amount of increase in amplitude of a pulse is determined or bounded by characteristics of components (e.g., transistors) generating the pulse to prevent damages to the components. For example, applying a voltage exceeding an overstress voltage (e.g., between a gate electrode and a drain electrode of a transistor or between the gate electrode and a source electrode of the transistor) to generate a pulse having increased amplitude causes damages to the transistor, thereby rendering the electrical device to be inoperable.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

The details of various embodiments of the methods and systems are set forth in the accompanying drawings and the description below.

DETAILED DESCRIPTION

Various aspects of a system, a device, and a method of amplifying amplitude of a pulse are disclosed herein.

In one or more embodiments, a device includes driver circuitry that receive an input pulse swinging or transitioning (e.g., repeatedly, periodically and/or regularly) between a first reference voltage (e.g., 0V or ground voltage) and a second reference voltage (e.g., supply voltage or VDD) higher than the first reference voltage. In one or more embodiments, the driver circuitry generates a driving pulse swinging between a third reference voltage and the second reference voltage according to the input pulse, where the third reference voltage is between the first reference voltage and the second reference voltage. In one or more embodiments, the device further includes a first transistor coupled to the driver circuitry. In one or more embodiments, the first transistor outputs an output pulse swinging between the first reference voltage and an output voltage according to the driving pulse from the driver circuitry, where the output voltage is higher than the second reference voltage.

In one or more embodiments, the output voltage is less than a sum of the third reference voltage and an overstress voltage of the first transistor.

In one or more embodiments, the device includes reconfigurable reference voltage generator circuitry coupled to the driver circuitry. In one or more embodiments, the reconfigurable reference voltage generator circuitry outputs a selected one of a predetermined number of reference voltages as the third reference voltage to the driver circuitry.

In one or more embodiments, the driver circuitry includes an input terminal to receive the input pulse, an output terminal to output the driving pulse, a first supply terminal to receive the second reference voltage, and a second supply terminal coupled to an output terminal of the reconfigurable reference voltage generator circuitry. In one or more embodiments, the second supply terminal receives the third reference voltage, an N-type transistor coupled between the second supply terminal and the output terminal of the driver circuitry, and a P-type transistor coupled between the first supply terminal and the output terminal of the driver circuitry. In one or more embodiments, the N-type transistor and the P-type transistor receive the input pulse and generate the driving pulse according to the input pulse, the second reference voltage received at the first supply terminal, and the third reference voltage received at the second supply terminal.

In one or more embodiments, the first transistor includes a first electrode to receive a source pulse swinging between the second reference voltage and the output voltage, a gate electrode coupled to the driver circuitry to receive the driving pulse, and a second electrode to output the output pulse according to the source pulse received at the first electrode of the first transistor and the driving pulse received at the gate electrode of the first transistor.

In one or more embodiments, the device includes a second transistor that includes a first electrode to receive a sink pulse swinging between the first reference voltage and the second reference voltage, a gate electrode to receive the second reference voltage, while the first electrode of the second transistor receives the sink pulse, and a second electrode coupled to the second electrode of the first transistor.

In one or more embodiments, the second transistor electrically couples the first electrode of the second transistor to the second electrode of the first transistor, in response to the first reference voltage of the sink pulse received at the first electrode of the second transistor, to generate the first reference voltage of the output pulse. In one or more embodiments, the second transistor electrically decouples the first electrode of the second transistor from the second electrode of the first transistor, in response to the second reference voltage of the sink pulse received at the first electrode of the second transistor, to generate the output voltage of the output pulse.

In one or more embodiments, the device includes cascaded inverters, where an output of the cascaded inverters is coupled to the first electrode of the second transistor. In one or more embodiments, the cascaded inverters generate the sink pulse according to the input pulse. In one or more embodiments, the cascaded inverters operate according to the first reference voltage and the second reference voltage.

In one or more embodiments, the device includes a capacitor and a third transistor. In one or more embodiments, the third transistor includes a first electrode coupled to a supply voltage rail, at which the second reference voltage is supplied, a gate electrode coupled to a first electrode of the capacitor, the gate electrode of the third transistor to receive charging pulse swinging between the first reference voltage and the second reference voltage, and a second electrode coupled to the first electrode of the first transistor and a second electrode of the capacitor.

In one or more embodiments, the third transistor electrically couples the supply voltage rail to the first electrode of the first transistor, in response to the first reference voltage of the charging pulse received at the gate electrode of the third transistor to generate the second reference voltage of the source pulse. In one or more embodiments, the third transistor electrically decouples the supply voltage rail from the first electrode of the first transistor, in response to the second reference voltage of the charging pulse received at the gate electrode of the third transistor, to generate the output voltage of the source pulse higher than the second reference voltage.

In one or more embodiments, the first transistor electrically couples the second electrode of the second transistor to the second electrode of the third transistor, in response to the third reference voltage of the driving pulse received at the gate electrode of the first transistor to generate the output voltage of the output pulse. In one or more embodiments, the first transistor electrically decouples the second electrode of the second transistor from the second electrode of the third transistor, in response to the second reference voltage of the driving pulse received at the gate electrode of the first transistor to generate the first reference voltage of the output pulse.

In one or more embodiments, the device includes cascaded inverters, where an output of the cascaded inverters is coupled to the gate electrode of the third transistor, and the cascaded inverters generate the charging pulse according to the input pulse. In one or more embodiments, the cascaded inverters operate according to the first reference voltage and the second reference voltage.

In one or more embodiments, the device includes additional cascaded inverters, where an output of the additional cascaded inverters is coupled to the first electrode of the second transistor. In one or more embodiments, the additional cascaded inverters generate the sink pulse according to the input pulse. In one or more embodiments, the additional cascaded inverters operate according to the first reference voltage and the second reference voltage. In one or more embodiments, the cascaded inverters and the additional cascaded inverters share at least one inverter.

In one or more embodiments, a system includes an adjustable driving pulse generator that receives an input pulse swinging between a first reference voltage and a second reference voltage higher than the first reference voltage. In one or more embodiments, the adjustable driving pulse generator generates a driving pulse swinging between a third reference voltage and the second reference voltage according to the input pulse. In one or more embodiments, the third reference voltage is between the first reference voltage and the second reference voltage, and the third reference voltage is selected from a plurality of predetermined voltages according to a control signal. The system includes a first transistor coupled to the adjustable driving pulse generator, where the first transistor outputs an output pulse swinging between the first reference voltage and an output voltage according to the driving pulse from the adjustable driving pulse generator. In one or more embodiments, the output voltage is higher than the second reference voltage. In one or more embodiments, the output voltage is less than a sum of the third reference voltage and an overstress voltage of the first transistor.

In one or more embodiments, the adjustable driving pulse generator includes reconfigurable reference voltage generator circuitry that output a selected one of the plurality of predetermined voltages as the third reference voltage according to the control signal. In one or more embodiments, the adjustable driving pulse generator includes driver circuitry having an input terminal to receive the input pulse. In one or more embodiments, the driver circuitry includes an output terminal to output the driving pulse. In one or more embodiments, the driver circuitry includes a first supply terminal to receive the second reference voltage. In one or more embodiments, the driver circuitry includes a second supply terminal coupled to an output terminal of the reconfigurable reference voltage generator circuitry, where the second supply terminal receives the third reference voltage. In one or more embodiments, the driver circuitry includes an N-type transistor coupled between the second supply terminal and the output terminal of the driver circuitry, and a P-type transistor coupled between the first supply terminal and the output terminal of the driver circuitry. In one or more embodiments, the N-type transistor and the P-type transistor receive the input pulse and generate the driving pulse according to the input pulse, the second reference voltage received at the first supply terminal and the third reference voltage received at the second supply terminal.

In one or more embodiments, the first transistor includes a first electrode to receive a source pulse swinging between the second reference voltage and the output voltage, a gate electrode coupled to the adjustable driving pulse. generator to receive the driving pulse, and a second electrode to output the output pulse according to the source pulse received at the first electrode of the first transistor and the driving pulse received at the gate electrode of the first transistor.

In one or more embodiments, the system further includes a second transistor including a first electrode to receive a sink pulse swinging, between the first reference voltage and the second reference voltage, a gate electrode to receive the second reference voltage, while the first electrode of the second transistor receives the sink pulse, and a second electrode coupled to the second electrode of the first transistor. In one or more embodiments, the second transistor electrically couples the first electrode of the second transistor to the second electrode of the first transistor, in response to the first reference voltage of the sink pulse received at the first electrode of the second transistor, to generate the first reference voltage of the output pulse. In one or more embodiments, the second transistor electrically decouples the first electrode of the second transistor from the second electrode of the first transistor, in response to the second reference voltage of the sink pulse received at the first electrode of the second transistor, to generate the output voltage of the output pulse.

In one or more embodiments, the system further includes a capacitor, and a third transistor, where the third transistor includes a first electrode coupled to a supply voltage rail, at which the second reference voltage is supplied, a gate electrode coupled to a first electrode of the capacitor, the gate electrode of the third transistor to receive a charging pulse swinging between the first reference voltage and the second reference voltage, and a second electrode coupled to the first electrode of the first transistor and a second electrode of the capacitor. In one or more embodiments, the third transistor electrically couples the supply voltage rail to the first electrode of the first transistor, in response to the first reference voltage of the charging pulse received at the gate electrode of the third transistor to generate the second reference voltage of the source pulse. In one or more embodiments, the third transistor electrically decouples the supply voltage rail from the first electrode of the first transistor, in response to the second reference voltage of the charging pulse received at the gate electrode of the third transistor, to generate the output voltage of the source pulse.

In one or more embodiments, a method of generating a pulse with increased amplitude includes receiving a clock pulse swinging between a first reference voltage and a second reference voltage higher than the first reference voltage, receiving a control signal indicating a selected voltage from a plurality of voltages, generating a driving pulse swinging between the second reference voltage and the selected voltage indicated by the control signal according to the clock pulse, the selected voltage between the first reference voltage and the second reference voltage, and generating, by a transistor, an output pulse swinging between an output voltage and the first reference voltage, according to the driving pulse. In one or more embodiments, the output voltage is higher than the second reference voltage, and the output voltage is less than a sum of the selected voltage and an overstress voltage of the transistor.

Advantageously, the system generates an electrical pulse having amplitude that exceeds an overstress voltage of a transistor. An overstress voltage (e.g., quantified in volts) of a transistor is a constraint (e.g., upper threshold or range) on a voltage difference to be applied between a gate electrode and a source electrode of the transistor, between a gate electrode and a drain electrode of the transistor, or a combination of them. In one approach, an overstress voltage is defined or specified by a fabrication facility or a fabrication company of a semiconductor based device including transistors. In one aspect, applying a third reference voltage between the first reference voltage and the second reference voltage, for example, to the gate electrode of the transistor enables a voltage at one of the drain electrode and the source electrode to be higher than the overstress voltage, while ensuring that a first difference between a voltage at the gate electrode and a voltage at a drain electrode of the transistor and a second difference between the voltage at the gate electrode and a voltage at a source electrode of the transistor are less than the overstress voltage of the transistor. Assuming for an example that an overstress voltage of a transistor is 0.95V and a supply voltage is 0.75V, if a pulse swinging between 0V and 0.75V is applied to a gate electrode of the transistor, an output pulse having amplitude that exceeds 0.95V at the drain electrode or the source electrode of the transistor damages the transistor. In one aspect, a pulse swinging between a reference voltage (e.g., 0.3V) and 0.75V is applied to the gate electrode of the transistor to enable amplitude of the pulse at the drain electrode or the source electrode of the transistor to be increased up to 1.25V for instance without damaging the transistor.

In some embodiments, the third reference voltage (applied to the gate electrode of the transistor) is adjustable. In one or more embodiments, the third reference voltage is adjustable from a predetermined range, or is selectable from a predetermined number of voltages. In one or more embodiments, the system automatically selects the third reference voltage, such that a first difference between a voltage at the gate electrode and a voltage at a drain electrode of the transistor and a second difference between the voltage at the gate electrode and a voltage at a source electrode of the transistor are less than the overstress voltage of the transistor. In some embodiments, a user selects the third reference voltage. In one aspect, the system allows the third reference voltage to be adaptively adjusted to enable a pulse to have target amplitude higher than the overstress voltage of the transistor without damaging the transistor or rendering the transistor inoperable. Assuming for an example that the overstress voltage of a transistor is 0.95V, a supply voltage VDD is 0.75V, and target amplitude of a pulse is 1.05V, the system automatically selects 0.3V (or 0.4V with an overhead) as the third reference voltage to be applied to the gate electrode of the transistor, because the selected voltage allows the output pulse to satisfy the overstress voltage of the transistor and the target amplitude.

Figure 1:
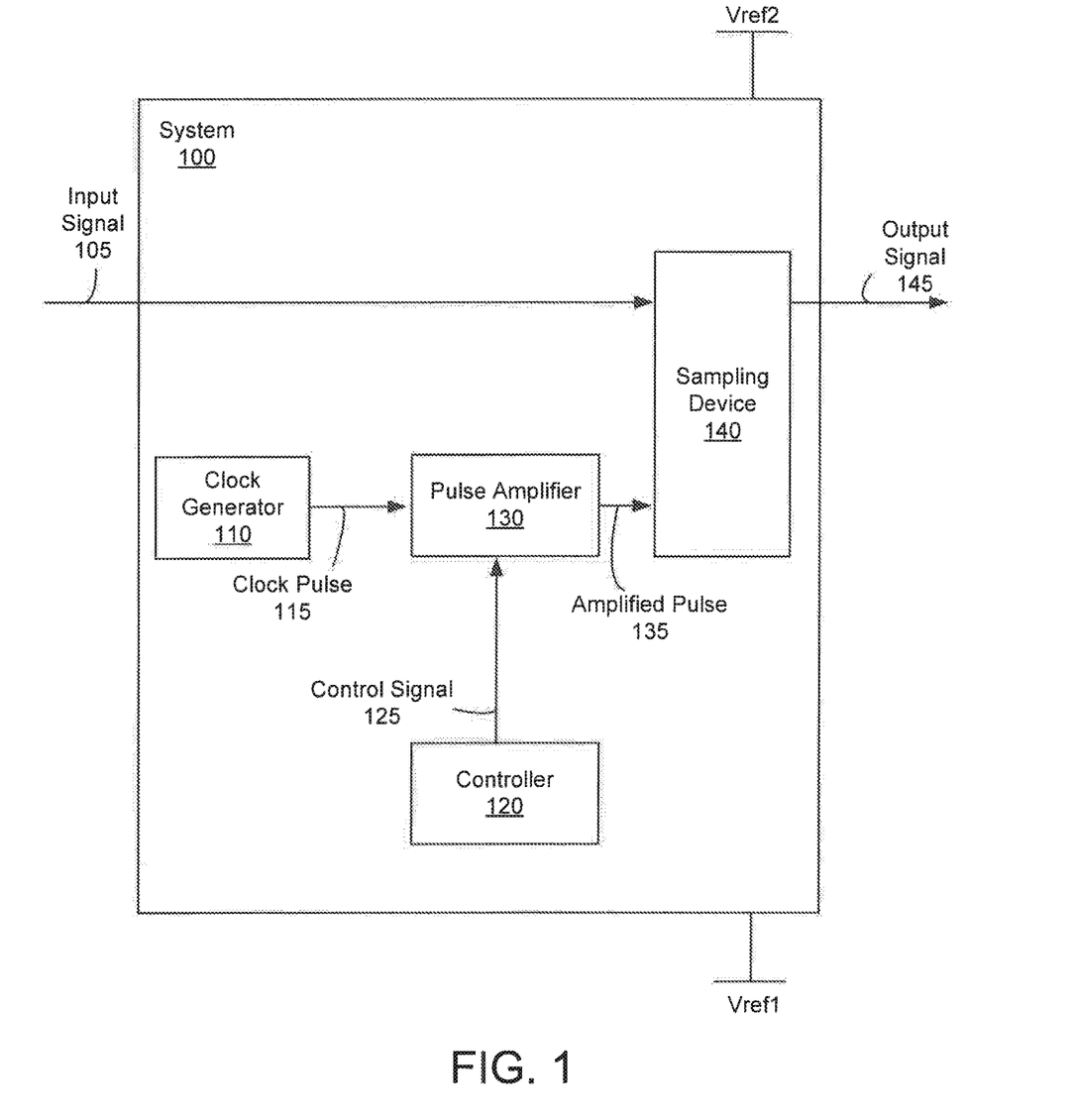
FIG. 1 is a diagram depicting an example system including a pulse amplifier, according to one or more embodiments.

Referring to FIG. 1, illustrated is a diagram depicting an example system 100 including a pulse amplifier 130, according to one or more embodiments. In some embodiments, the system 100 includes a clock generator 110, a controller 120, a pulse amplifier 130, and a sampling device 140. In some embodiments, the system 100 includes a sink voltage rail, through which a first reference voltage Vref1 is supplied, and a supply voltage rail, through which a second reference voltage Vref2 is supplied. In some embodiments, the components of the system 100 are implemented together on a same semiconductor die or device, and powered by the first reference voltage Vref1 (e.g., ground voltage or 0V) and the second reference voltage Vref2 (e.g., supply voltage or VDD). During operation, these components operate together to receive an input signal 105, and perform sampling on the input signal 105 to generate an output signal 145. In other embodiments, the system 100 includes more, fewer, or different components than shown in FIG. 1.

The clock generator 110 includes or corresponds to circuitry that generates a clock pulse 115. A clock pulse 115 includes or corresponds to an electrical signal having a voltage, current, or both that change, for example, according to a particular frequency. In some embodiments, the frequency of the clock pulse 115 is predetermined. In some embodiments, the frequency of the clock pulse 115 is selected from a predetermined number of frequencies, for instance by the controller 120 or another component of the system 100. In some embodiments, the clock pulse 115 has 50% duty cycle or non-50% duty cycle. In some embodiments, a duty cycle of the clock pulse 115 is predetermined, dynamically adjusted, or a combination of them. In some embodiments, the clock pulse 115 has or corresponds to a voltage (signal) that swings or transitions between the first reference voltage Vref1 and the second reference voltage Vref2. In some embodiments, the clock generator 110 includes an output terminal, through which the clock pulse 115 is provided, transmitted, or supplied to the pulse amplifier 130.

The controller 120 includes or corresponds to circuitry that generates a control signal 125 for configuring the pulse amplifier 130. The control signal 125 includes or corresponds to a signal that indicates a target operating parameter of the pulse amplifier 130. The control signal 125 indicates the target operating parameter in an analog representation or a digital representation, In one example, the control signal 125 indicates target amplitude of an amplified pulse 135 that is output from the pulse amplifier 130. In another example, the control signal 125 indicates a reference voltage between the first reference voltage Vref1 and the second reference voltage Vref2 to be applied for generating the amplified pulse 135 with the target amplitude. In one approach, the controller 120 obtains a predetermined target amplitude or obtains a user selection of the target amplitude, and the controller 120 (e.g., automatically) determines the reference voltage to be applied for generating the amplified pulse 135 with the target amplitude. In one example, the controller 120 stores a look up table (or other data construct) that maps between target amplitude and a corresponding reference voltage to be applied, determines the reference voltage for given target amplitude according to the look up table, and/or generates the control signal 125 indicating the determined reference voltage. In another approach, the controller 120 receives a user command or a signal that specifies the target reference voltage to be applied for generating the amplified pulse 135, and/or generates the control signal 125 indicating the target reference voltage specified by the user command or the signal. In some embodiments, the controller 120 includes an output terminal, through which the control signal 125 is provided, transmitted, or supplied to the pulse amplifier 130.

The pulse amplifier 130 includes or corresponds to circuitry that amplifies the clock pulse 115. In one configuration, the pulse amplifier 130 includes a pulse input terminal coupled to the output terminal of the clock generator 110, a control terminal coupled to the output terminal of the controller 120, and an output terminal coupled to a pulse input terminal of the sampling device 140. In this configuration, the pulse amplifier 130 receives the clock pulse 115 through the pulse input terminal and the control signal 125 through the control terminal, generates the amplified pulse 135 according to the clock pulse 115 and the control signal 125, and/or provides, outputs, supplies or transmits the amplified pulse 135 to the sampling device 140 through its output terminal. In one aspect, the pulse amplifier 130 generates the amplified pulse 135 having amplitude larger than a difference between the first reference voltage Vref1 and the second reference voltage Vref2 according to the control signal 125. For example, the amplified pulse 135 swings or transitions between the first reference voltage Vref1 and an output voltage that is higher than the second reference voltage Vref2. In one approach, the control signal 125 indicating a higher reference voltage causes the pulse amplifier 130 to generate the amplified pulse 135 having larger amplitude. In one aspect, the pulse amplifier 130 generates the amplified pulse 135 having amplitude larger than an overstress voltage of one or more transistors of the pulse amplifier 130. Detailed implementations and operations of the pulse amplifier 130 are provided below with respect to FIGS. 2-7.

The sampling device 140 includes or corresponds to circuitry that performs sampling on the input signal 105 to obtain the output signal 145 according to the amplified pulse 135. In one configuration, the sampling device 140 includes an input terminal, the pulse input terminal coupled to the output terminal of the pulse amplifier 130, and an output terminal. In this configuration, the sampling device 140 receives the input signal 105 through its input terminal and the amplified pulse 135 through the pulse input terminal, and/or samples the input signal 105 according to the amplified pulse 135 to generate the output signal 145 at its output terminal. In one aspect, the input signal 105 is an analog signal that includes a time-varying voltage or current. In some embodiments, the sampling device 140 samples the input signal 105, when the amplified pulse 135 has the output voltage higher than the second reference voltage, or when the amplified pulse 135 transitions from one of the first reference voltage Vref1 to the output voltage or from the output voltage to the first reference voltage Vref1. In some embodiments, the sampling device 140 transmits, provides, or outputs the sampled signal as the output signal 145 through its output terminal. In one example, the output signal 145 is provided to an analog-to-digital converter or quantization circuitry to perform quantization on the sampled signal (or the output signal 145) or obtain a digital representation of the sampled signal.

Figure 2:
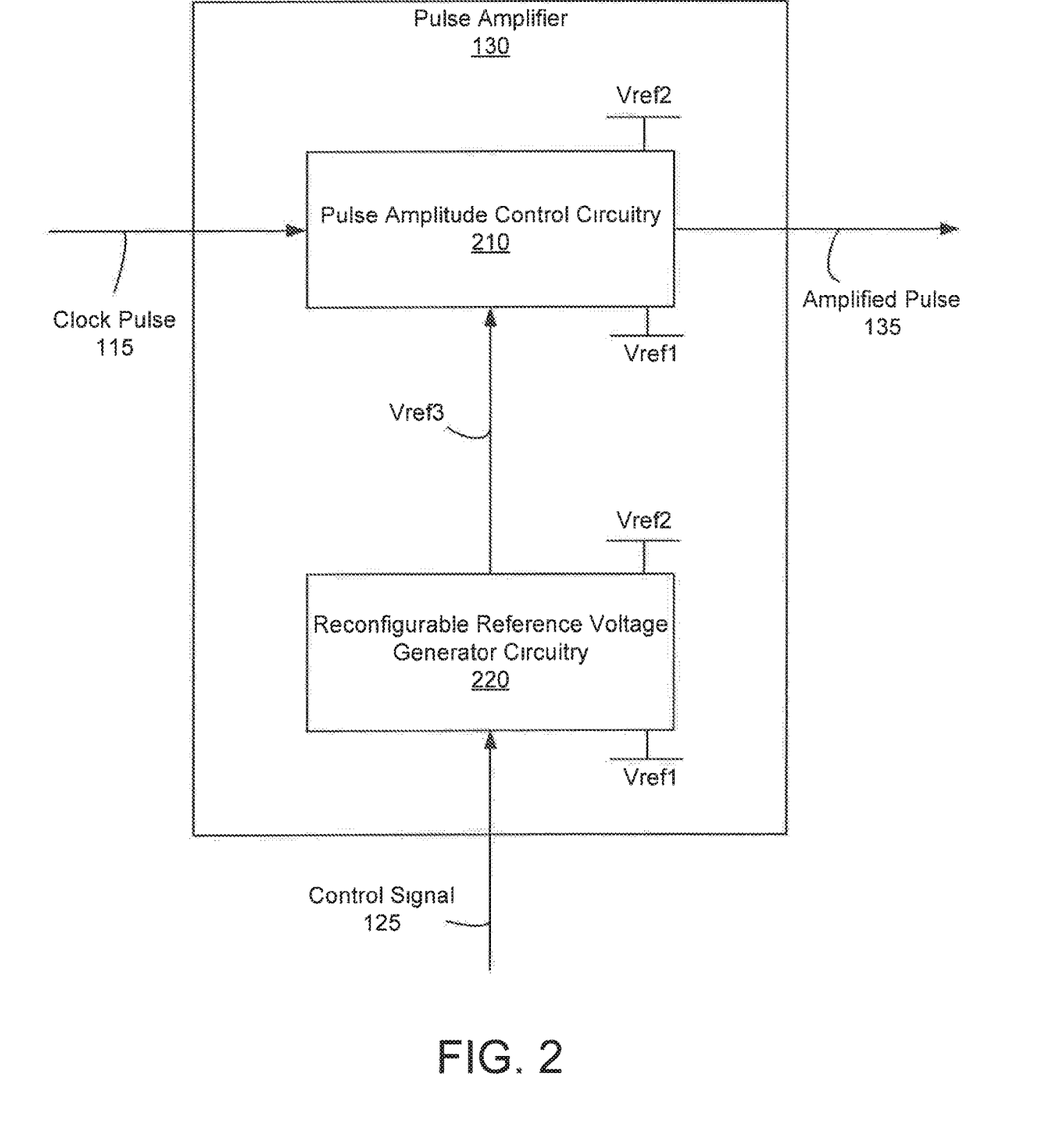
FIG. 2 is a diagram depicting an example pulse amplifier, according to one or more embodiments.

Referring to FIG. 2, illustrated is a diagram depicting the example pulse amplifier 130, according to one or more embodiments. In some embodiments, the pulse amplifier 130 includes pulse amplitude control circuitry 210 and reconfigurable reference voltage generator circuitry 220. In some embodiments, these components are powered by the first reference voltage Vref1 (e.g., ground voltage or 0V) and the second reference voltage Vref2 (e.g., supply voltage or VDD). In one or more embodiments, these components operate together to receive the clock pulse 115 and the control signal 125, and generate the amplified pulse 135 having amplitude higher than a difference between the first reference voltage Vref1 and the second reference voltage Vref2, according to the clock pulse 115 and the control signal 125. In certain embodiments, the pulse amplifier 130 includes more, fewer, or different components than shown in FIG. 2.

The reconfigurable reference voltage generator circuitry 220 includes or corresponds to circuitry that generates a reference voltage Vref3, based on which the pulse amplitude control circuitry 210 generates the amplified pulse 135, In one configuration, the reconfigurable reference voltage generator circuitry 220 includes a control terminal coupled to the controller 120 and an output terminal coupled to a reference voltage terminal of the pulse amplitude control circuitry 210. In this configuration, the reconfigurable reference voltage generator circuitry 220 receives the control signal 125 through the control terminal, generates the reference voltage Vref3 according to the control signal 125, and transmits, provides, or outputs the reference voltage Vref3 through its output terminal to the pulse amplitude control circuitry 210. In one aspect, the reconfigurable reference voltage generator circuitry 220 selects, from a predetermined number of voltages, the reference voltage Vref3 to be output according to the control signal 125. In some embodiments, the reconfigurable reference voltage generator circuitry 220 is implemented as a digital-to-analog converter. In one example, the control signal 125 indicates a target reference voltage to be applied to the pulse amplitude control circuitry 210 in a digital representation. In this example, the reconfigurable reference voltage generator circuitry 220 generates a corresponding reference voltage Vref3 in an analog representation, according to the control signal 125. Detailed implementations and operations of the reconfigurable reference voltage generator circuitry 220 are provided below with respect to FIG. 5.

The pulse amplitude control circuitry 210 includes or corresponds to circuitry that receives the clock pulse 115, and generates the amplified pulse 135. In one configuration, the pulse amplitude control circuitry 210 includes a pulse input terminal coupled to the output terminal of the clock generator 110, the reference voltage terminal coupled to the output terminal of the reconfigurable reference voltage generator circuitry 220, and an output terminal of the pulse amplitude control circuitry 210. In this configuration, the pulse amplitude control circuitry 210 receives the clock pulse 115 through the pulse input terminal, receives the reference voltage Vref3 through the reference voltage terminal, and/or generates the amplified pulse 135 according to the clock pulse 115 and the reference voltage Vref3. In one aspect, the pulse amplitude control circuitry 210 generates the amplified pulse 135 having amplitude larger than a difference between the first reference voltage Vref1 and the second reference voltage Vref2, according to the reference voltage Vref3. For example, the pulse amplitude control circuitry 210 generates the amplified pulse 135 that swings or transitions between the first reference voltage Vref1 and an output voltage that is higher than the second reference voltage Vref2 according to the reference voltage Vref3. The pulse amplitude control circuitry 210 transmits, provides, or outputs the amplified pulse 135 to the sampling device 140 through its output terminal. Detailed implementations and operations of the pulse amplitude control circuitry 210 are provided below with respect to FIGS. 3 and 4.

Figure 3:
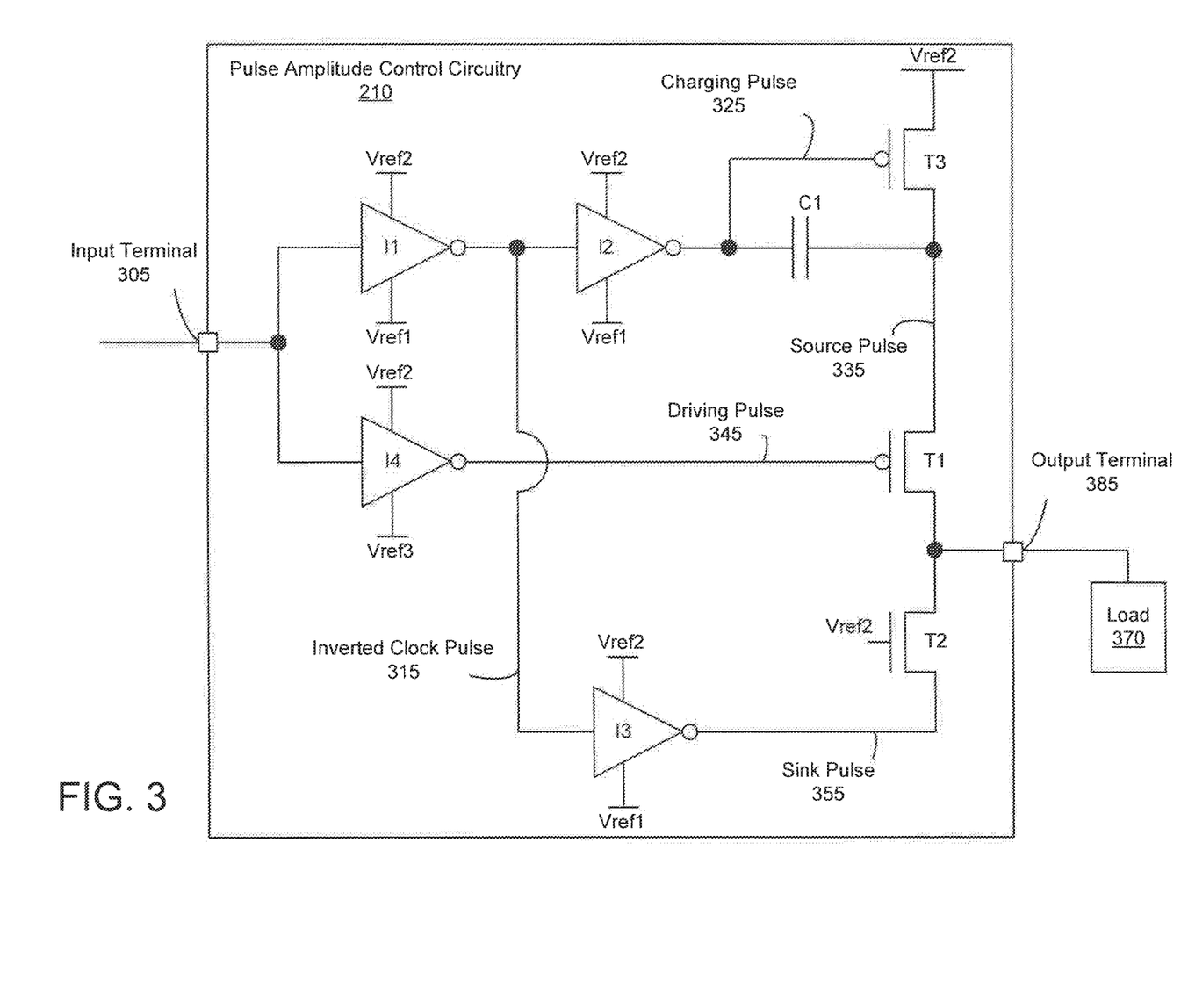
FIG. 3 is a diagram depicting example pulse amplitude control circuitry of the example pulse amplifier shown in FIG. 2, according to one or more embodiments.

Referring to FIG. 3, illustrated is a diagram depicting example pulse amplitude control circuitry 210 shown in FIG. 2, according to one or more embodiments. In one or more embodiments, the pulse amplitude control circuitry 210 includes an input terminal 305, for example, to receive the clock pulse 115, and an output terminal 385, for example to, output the amplified pulse 135 to a load 370. In some embodiments, the load 370 is a switching transistor of the sampling device 140 or any circuitry. In one aspect, the load 370 is modeled as a capacitive load for instance (although other type(s) of load are possible). In one or more embodiments, the pulse amplitude control circuitry 210 includes inverters (or driver circuitry) I1, I2, I3, driver circuitry I4, a capacitor and transistors T1, T2, T3. In some embodiments, these components except the driver circuitry I4 are powered by the first reference voltage Vref1 (e.g., ground voltage or 0V) and the second reference voltage Vref2 (e.g., supply voltage or VDD), In some embodiments, the driver circuitry I4 is powered by the third reference voltage Vref3 (e.g., 0.3V) and the second reference voltage Vref2 (e.g., supply voltage or VDD). These components operate together to receive the clock pulse 115, and generate the amplified pulse 135 having amplitude that is larger than a difference between the first reference voltage Vref1 and the second reference voltage Vref2. In one aspect, the amplitude of the amplified pulse 135 is larger than an overstress voltage of the transistor T1 by applying the reference voltage Vref3. In other embodiments, the pulse amplitude control circuitry 210 includes more, fewer, or different components than shown in FIG. 3. In some embodiments, the transistors T1 and T3 are P-type transistors (e.g., PMOS transistor or PNP transistor), and the transistor T2 is N-type transistor NMOS transistor or NPN transistor). In some embodiments, the transistors T1, T2, T3 are implemented by one or more types of transistors.

In some embodiments, the inverter I1 includes: an input terminal coupled to the input terminal 305 of the pulse amplitude control circuitry 210; and an output terminal coupled to an input terminal of the inverter I2 and an input terminal of the inverter I3. In this configuration, the inverter I1 receives the clock pulse 115 that swings or transitions between the first reference voltage Vref1 and the second reference voltage Vref2 through its input terminal, and generates an inverted clock pulse 315 having an inverted phase of the clock pulse 115. In one aspect, the inverted clock pulse 315 swings or transitions between the first reference voltage Vref1 and the second reference voltage Vref2. In some embodiments, the inverter I1 transmits, supplies, or provides the inverted clock pulse 315 to the inverters I2, I3.

In some embodiments, the inverter I2 includes: an input terminal coupled to the output terminal of the inverter I1; and an output terminal coupled to a first electrode of the capacitor C1 and a gate electrode of the transistor T3. In this configuration, the inverter I2 receives the inverted clock pulse 315 through its input terminal, and generates a charging pulse 325 having an inverted phase of the inverted clock pulse 315. In one aspect, the charging pulse 325 swings or transitions between the first reference voltage Vref1 and the second reference voltage Vref2, and is synchronized with the clock pulse 115 or is delayed from the clock pulse 115 for instance. In some embodiments, the inverter I2 transmits, supplies, or provides the charging pulse 325 to the capacitor C1 and the transistor T3.

In some embodiments, the capacitor C1 includes a first electrode and a second electrode. In some embodiments, the first electrode of the capacitor C1 is coupled to the output terminal of the inverter I2 and a gate electrode of the transistor T3. In some embodiments, the second electrode of the capacitor C1 is coupled to a first electrode (e.g., source electrode) of the transistor T1 and a second electrode (e.g., drain electrode) of the transistor T3. In this configuration, the capacitor C1 stores charges according to a voltage of the charging pulse 325.

In some embodiments, the transistor T3 includes the gate electrode, a first electrode (e.g., source electrode), and the second electrode. In some embodiments, the gate electrode of the transistor T3 is coupled to the output terminal of the inverter I2 and the first electrode of the capacitor C1 In some embodiments, the first electrode (e.g., source electrode) of the transistor T3 is coupled to the supply voltage rail, at which the second reference voltage Vref2 is supplied. In some embodiments, the second electrode (e.g., drain electrode) of the transistor T3 is coupled to the second electrode of the capacitor C1 and the first electrode (e.g., source electrode) of the transistor T1. In this configuration, the transistor T3 electrically couples or decouples the supply voltage rail from the second electrode of the transistor T3 and the second electrode of the capacitor C1, according to a voltage of the charging pulse 325. Electrically coupling between two electrodes refers to enabling current through the two electrodes such that voltages at the two electrodes become substantially equal to each other or dependent on each other. Electrically decoupling herein refers to disabling current through the two electrodes such that voltages at the two electrodes become independent from each other. In one example, when a difference between a voltage of the charging pulse 325 and the second reference voltage Vref2 is larger than a threshold voltage (e.g., 0.3V) of the transistor T3, the transistor T3 electrically couples the supply voltage rail to the second electrode of the transistor T3 and the second electrode of the transistor C1 such that a voltage at the second electrode of the capacitor C1 and the voltage at the second electrode of the transistor T3 become substantially equal to the second reference voltage Vref2. In another example, when a difference between a voltage of the charging pulse 325 and the second reference voltage Vref2 is less than the threshold voltage (e.g., 0.3V) of the transistor T3, the transistor T3 electrically decouples the supply voltage rail from the second electrode of the transistor T3 and the second electrode of the transistor C1, such that a voltage at the second electrode of the capacitor C1 and the voltage at the second electrode of the transistor T3 become independent from the second reference voltage Vref2. Accordingly, if the charging pulse 325 has the first reference voltage Vref1, then a voltage at the second electrode of the transistor T3 and the voltage at the first electrode of the transistor T1 become substantially equal to the second reference voltage Vref2. In addition, if the charging pulse 325 has the second reference voltage Vref2, then a voltage at the second electrode of the transistor T3 and the voltage at the first electrode of the transistor T1 become an output voltage higher than the second reference voltage Vref2, because the capacitor C1 stores and holds charges and the second electrode of the capacitor C1 and the second electrode of the transistor T3 are electrically floated from the supply voltage rail. Hence, the transistor T3 generates a source pulse 335 at the second electrode of the transistor T3, according to varying voltages of the charging pulse 325 applied to the gate electrode of the transistor T3.

In some embodiments, the inverter I3 includes: an input terminal coupled to the output terminal of the inverter I1; and an output terminal coupled to a first electrode (e.g., source electrode) of the transistor T2. In this configuration, the inverter I3 receives the inverted clock pulse 315 through its input terminal, and generates a sink pulse 355 having an inverted phase of the inverted clock pulse 315. In one aspect, the sink pulse 355 swings or transitions between the first reference voltage Vref1 and the second reference voltage Vref2, and is synchronized with the clock pulse 115 or is delayed from the clock pulse 115. In some embodiments, the inverter I3 transmits, supplies, or provides the sink pulse 355 to the transistor T2.

In some embodiments, the transistor T2 includes: a gate electrode coupled to the supply voltage terminal to receive the second reference voltage Vref2; the first electrode (e.g., source electrode) coupled to the output terminal of the inverter I3; and/or a second electrode (e.g., drain electrode) coupled to the output terminal 385 of the pulse amplitude control circuitry 210. In this configuration, the transistor T2 electrically couples or decouples the output terminal of the inverter I3 from the output terminal 385 of the pulse amplitude control circuitry 210, according to a voltage of the sink pulse 355. In one example, when a difference between a voltage of the sink pulse 355 and the second reference voltage Vref2 is larger than a threshold voltage (e.g., 0.3V) of the transistor T2, the transistor T2 electrically couples the output terminal of the inverter I3 to the output terminal 385 of the pulse amplitude control circuitry 210, such that a voltage of the amplified pulse 135 at the output terminal 385 becomes substantially equal to the voltage of the sink pulse 355. In another example, when a difference between a voltage of the sink pulse 355 and the second reference voltage Vref2 is less than the threshold voltage (e.g., 0.3V) of the transistor T2, the transistor T2 electrically decouples the output terminal of the inverter I3 from the output terminal 385 of the pulse amplitude control circuitry 210, such that a voltage of the amplified pulse 135 at the output terminal 385 becomes independent from the voltage of the sink pulse 355. Accordingly, if the sink pulse 355 has the first reference voltage Vref1, then a voltage of the amplified pulse 135 at the output terminal 385 becomes substantially equal to the first reference voltage Vref1. In addition, if the sink pulse 355 has the second reference voltage Vref2, then a voltage of the amplified pulse 135 at the output terminal 385 becomes independent from the voltage of the sink pulse 355, because the output terminal 385 is electrically floated from the output terminal of the inverter I3.

In some embodiments, the driver circuitry I4 includes: an input terminal coupled to the input terminal 305 of the pulse amplitude control circuitry 210; and/or an output terminal coupled to a gate electrode of the transistor T1. In one configuration, the driver circuitry I4 has a similar structure of an inverter, except the driver circuitry I4 is powered by the third reference voltage Vref3 from the reconfigurable reference voltage generator circuitry 220 and/or the second reference voltage Vref2. In some embodiments, the third reference voltage Vref3 (e.g., 0.3V) is between the first reference voltage Vref1 (e.g., ground voltage or 0V) and the second reference voltage Vref2 (e.g., supply voltage or 0.75V for instance). In some embodiments, the third reference voltage Vref3 is lower than a ceiling voltage, where the ceiling voltage (e.g., 0.45V) is less than the second reference voltage Vref2 (e.g., supply voltage or 0.75V for instance) by the threshold voltage (e.g., 0.3V) of the transistor T1. In this configuration, the driver circuitry I4 receives the clock pulse 115 that swings or transitions between the first reference voltage Vref1 and the second reference voltage Vref2 through its input terminal, and generates a driving pulse 345 having an inverted phase of the clock pulse 115. In one aspect, the driving pulse 345 swings or transitions between the second reference voltage Vref2 and the third reference voltage Vref3. In some embodiments, the driver circuitry I4 transmits, supplies, or provides the driving pulse 345 to the transistor T1.

In some embodiments, the transistor T1 includes: a gate electrode coupled to the output terminal of the driver circuitry I4; the first electrode (e.g., source electrode) coupled to the second electrode (e.g., drain electrode) of the transistor T3 and the second electrode of the capacitor C1; and/or the second electrode (e.g., drain electrode) coupled to the output terminal 385 of the pulse amplitude control circuitry 210. In this configuration, the transistor T1 electrically couples or decouples the second electrode (e.g., drain electrode) of the transistor T3 and the second electrode of the capacitor C1 from the output terminal 385 of the pulse amplitude control circuitry 210, according to a voltage of the driving pulse 345. In one example, when a difference between a voltage of the driving pulse 345 and a voltage of the source pulse 335 is larger than a threshold voltage (e.g., 0.3V) of the transistor T1, the transistor T1 electrically couples the second electrode of the transistor T3 and the second electrode of the capacitor C1 to the output terminal 385, such that a voltage at the output terminal 385 of the pulse amplitude control circuitry 210 becomes substantially equal to the voltage of the source pulse 335. In another example, when a difference between a voltage of the driving pulse 345 and a voltage of the source pulse 335 is less than the threshold voltage (e.g., 0.3V) of the transistor T1, the transistor T1 electrically decouples the second electrode of the transistor T3 and the second electrode of the capacitor C1 from the output terminal 385 of the pulse amplitude control circuitry 210, such that a voltage at the output terminal 385 of the pulse amplitude control circuitry 210 becomes independent from the voltage of the source pulse 335. Accordingly, if the driving pulse 345 has the third reference voltage Vref3 (e.g., 0.3V), then a voltage of the amplified pulse 135 at the output terminal 385 becomes substantially equal to the voltage of the source pulse 335, because the source pulse swings between the second reference voltage Vref2 and the output voltage higher than the second reference voltage Vref2 and the difference between the output voltage or the second reference voltage Vref2 of the source pulse 335 and the third reference voltage Vref3 is larger than the threshold voltage of the transistor T1. In addition, if the driving pulse 345 has the second reference voltage Vref2, then a voltage of the amplified pulse 135 at the output terminal 385 becomes independent from the voltage of the source pulse 335, because the difference between the output voltage of the source pulse 335 and the second reference voltage Vref2 is less than the threshold voltage of the transistor T1 and the output terminal 385 becomes electrically floated from the capacitor C1 and the transistor T3.

In one aspect, the transistors T1 and T2 alternate to generate, supply or output voltages of amplified pulse 135 at the output terminal 385. For example and in one approach, the transistor T1 supplies the output voltage of the source pulse 335 higher than the second reference voltage Vref2 to the output terminal 385 while the transistor T2 electrically decouples or floats the output terminal 385 from the output terminal of the inverter I3. Similarly, the transistor T2 supplies the first reference voltage Vref1 of the sink pulse 355 to the output terminal 385 while the transistor T1 electrically decouples or floats the output terminal 385 from the second electrode of the transistor T3 and the second electrode of the capacitor C1. Hence, the amplified pulse 135 at the output terminal 385 of the pulse amplitude control circuitry 210 swings or transitions between the first reference voltage Vref1 and the output voltage. Accordingly, the amplified pulse 135 has amplitude higher than a difference between the first reference voltage Vref1 and the second reference voltage Vref2.

Advantageously, applying the driving pulse that swings between the third reference voltage Vref3 and the second reference voltage Vref2 enables amplitude of the amplified pulse 135 to be increased or extended (e.g., relative to or beyond the overstress voltage of the transistor T1). If a pulse swinging between the first reference voltage Vref1 and the second reference voltage Vref2 was applied to the gate electrode of the first transistor T1, then amplitude of a pulse output by the output terminal 385 is bounded by the overstress voltage of the transistor T1, because applying the first reference voltage Vref1 at the gate electrode of the transistor T1 and applying a voltage exceeding the overstress voltage of the transistor T1 cause damage to the transistor T1 and render the transistor T1 inoperable. By applying the driving pulse 345 swinging between the third reference voltage Vref3 and the second reference voltage Vref2, the pulse amplitude control circuitry 210 is capable of generating the amplified pulse 135 with amplitude exceeding the overstress voltage of the transistor T1 without damaging the transistor T1. For example, the first reference voltage Vref1 is 0V, the second reference voltage Vref2 is 0.75V, the third reference voltage Vref3 is 0.3V, and the overstress voltage of the transistor T1 is 0.95V. In this example, the pulse amplitude control circuitry 210 is capable of generating the amplified pulse 135 with amplitude of 1.05V that exceeds the overstress voltage of the transistor T1 without damaging the transistor T1, because a largest voltage difference between the gate electrode and the first electrode (e.g., source terminal) of the transistor T1 is 0.75V (e.g., 1.05V minus 0.3V) that is less than the overstress voltage of 0.95V.

In one aspect, the inverters I1 and I2 form a first set of cascaded inverters, and the inverters I1 and I3 form a second set of cascaded inverters, where the first set of cascaded inverters and the second set of cascaded inverters share the inverter. Having cascaded inverters sharing one or more inverters allows hardware resources to be conserved and allows synchronous operations of different components (e.g., transistors T1, T2, T3) of the pulse amplitude control circuitry 210. In some embodiments, the inverter I3 is omitted, and the charging pulse 325 is supplied to the first electrode of the transistor T2 instead of the sink pulse 355.

Figure 4:
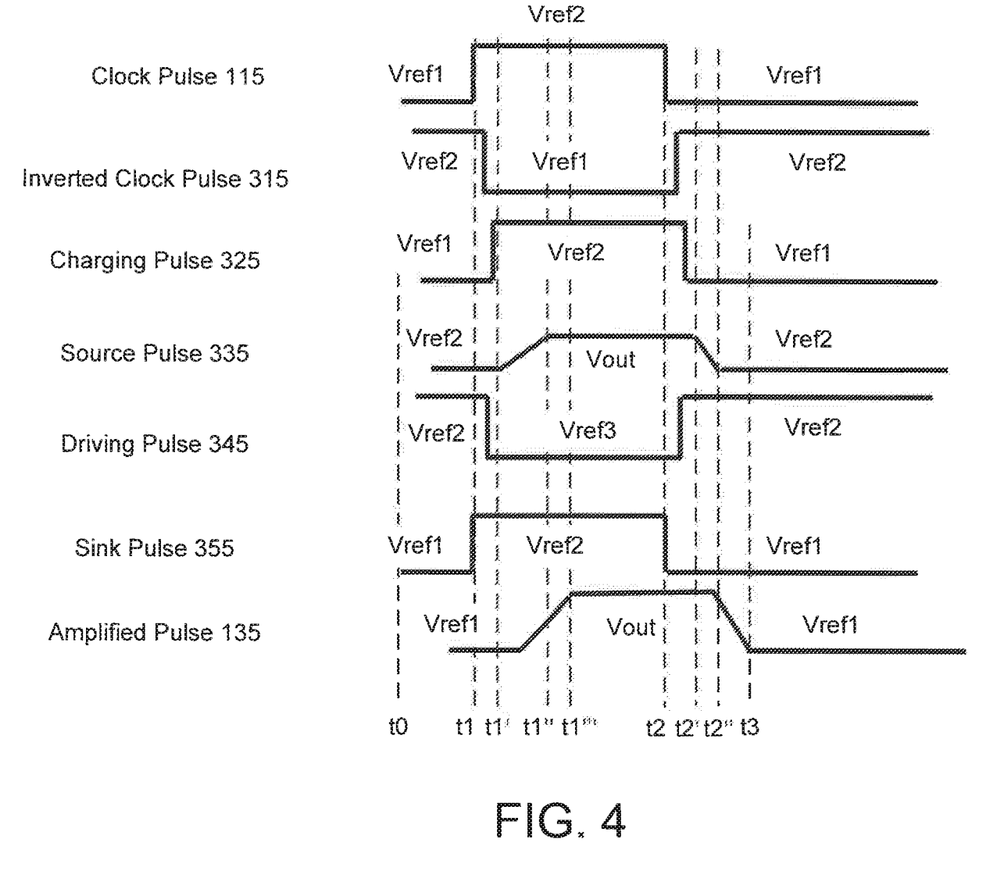
FIG. 4 is a timing diagram of pulses depicting example operations of the pulse amplitude control circuitry shown in FIG. 3, according to one or more embodiments.

Referring to FIG. 4, illustrated is a timing diagram of pulses depicting example operations of the pulse amplitude control circuitry 210 shown in FIG. 3, according to one or more embodiments. In one aspect, the clock pulse 115 swings between the first reference voltage Vref1 and the second reference voltage Vref2. In one example, the clock pulse 115 has the first reference voltage Vref1 between time t0 and t1, has the second reference voltage Vref2 between time t1 and t2, and has the first reference voltage Vref1 after time t2.

In response to the clock pulse 115, the inverter I1 generates the inverted clock pulse 315 that swings between the second reference voltage Vref2 and the first reference voltage Vref1. In some embodiments, the inverted clock pulse 315 has an inverted phase of the clock pulse 115.

In response to the inverted clock pulse 315, the inverter I2 generates the charging pulse 325 that swings between the first reference voltage Vref1 and the second reference voltage Vref2. In some embodiments, the charging pulse 325 has an inverted phase of the inverted clock pulse 315. In one aspect, the charging pulse 325 is synchronized with the clock pulse 115 or is delayed from the clock pulse 115 by a first amount.

In response to the inverted clock pulse 315, the inverter I3 generates the sink pulse 355 that swings between the first reference voltage Vref1 and the second reference voltage Vref2. In some embodiments, the sink pulse 355 has an inverted phase of the inverted clock pulse 315. In one aspect, the sink pulse 355 is synchronized with the clock pulse 115 or is delayed from the clock pulse 115 by a second amount. In one or more embodiments, the first amount is substantially equal to the second amount, or is different from the second amount.

In response to the clock pulse 115 at the input terminal 305, the driver circuitry I4 generates the driving pulse 345 that swings between the third reference voltage Vref3 and the second reference voltage Vref2. In some embodiments, the driving pulse 345 has an inverted phase of the clock pulse 115.

In response to the charging pulse 325, the transistor T3 and the capacitor C1 generate the source pulse 335 that swings between the second reference voltage Vref2 and the output voltage Vout (which is higher than the second reference voltage Vref2). In some embodiments, the source pulse 335 has an inverted phase of the charging pulse 325. In one approach, the first reference voltage Vref1 of the charging pulse 325 applied to the gate electrode between times t0 and t1' causes the transistor T3 to operate or conduct such that the second reference voltage Vref2 is applied to the second electrode of the capacitor C1 and the first reference voltage Vref1 is applied to the first electrode of the capacitor C1. Hence, the capacitor C1 stores charge amount Q at time t1', according to capacitance of the capacitor C1 and a difference between the second reference voltage Vref2 and the first reference voltage Vref1. At time t1', a voltage of the charging pulse 325 transitions to the second reference voltage Vref2, and the transistor T3 electrically decouples the supply voltage rail from the second electrode of capacitor C1 and the first electrode of the transistor T1. Because the voltage of the charging pulse 325 at the first electrode of the capacitor CI transitions to the second reference voltage Vref2 at time t1' and the capacitor C1 stores and holds the charge amount Q even after time t1', a voltage of the source pulse 335 at the second electrode of the capacitor C1 and the first electrode of the transistor T1 increases to the output voltage Vout higher than the second reference voltage Vref2 at time t1". After the charging pulse 325 transitions to the first reference voltage Vref1 at time t2', the transistor T3 electrically couples the second electrode of the capacitor C1 and the first electrode of the transistor T1 to the supply voltage rail, such that a voltage of the source pulse 335 decreases to the second reference voltage Vref2 at time t2".

In some embodiments, the transistors T1, T2 generate or output the amplified pulse 135, according to the source pulse 335, the driving pulse 345, and the sink pulse 355. In some embodiments, between time t0 and t1, in response to the first reference voltage Vref1 of the sink pulse 355, the transistor T2 electrically couples the output terminal 385 to the output terminal of the inverter I3. In some embodiments, between time t0 and t1, the transistor T1 electrically decouples the second electrode of the transistor T3 and the second electrode of the capacitor C1 from the output terminal 385, in response to the second reference voltage Vref2 of the driving pulse 345. Hence, between time t0 and time t1, the voltage of the amplified pulse 135 becomes substantially equal to the first reference voltage Vref1.

In some embodiments, between time t1 and t2, in response to the second reference voltage Vref2 of the sink pulse 355, the transistor T2 electrically decouples the output terminal 385 from the output terminal of the inverter I3. In some embodiments, between time t1' and t2, the transistor T1 electrically couples the second electrode of the transistor T3 and the second electrode of the capacitor C1 to the output terminal 385, in response to the third reference voltage Vref3 of the driving pulse 345. Hence, between time t1''' and time t2", the voltage of the amplified pulse 135 is held at the output voltage Vout.

In some embodiments, between time t2 and t3, in response to the first reference voltage Vref1 of the sink pulse 355, the transistor T2 electrically couples the output terminal 385 to the output terminal of the inverter I3. In some embodiments, between time t2' and t3, the transistor T1 electrically decouples the second electrode of the transistor T3 and the second electrode of the capacitor C1 from the output terminal 385, in response to the second reference voltage Vref2 of the driving pulse 345. Hence, after time t3, the voltage of the amplified pulse 135 is held at the first reference voltage Vref1.

In some embodiments, the output voltage Vout is determined by a capacitance of the load 370. In one aspect, between time t0 and t1, the transistor T1 electrically decouples the second electrode of the capacitor C1 and the second electrode of the transistor T3 from the output terminal 385, while the transistor T3 electrically couples the second electrode of the capacitor C1 and the first electrode of the transistor T1 to the supply voltage rail to supply the second reference voltage Vref2. Hence, the capacitor C1 stores a charge amount Q at time t1. In one aspect, between time t1''' and t2, the transistor T1 electrically couples the second electrode of the capacitor C1 and the second electrode of the transistor T3 to the output terminal 385, while the transistor T3 electrically decouples the second electrode of the capacitor C1 and the first electrode of the transistor T1 from the supply voltage rail and while the transistor T2 electrically decouples the output terminal of the inverter I3 from the output terminal 385. Hence, between time t1''' and t2, the charge amount Q is shared between the capacitance of the capacitor C1 and the capacitance of the load 370. In one aspect, the output voltage Vout is represented as the following equation according to charge sharing:

$$V_{out} = V_{ref2} \times C_1 \div (C_1 + C_{load}) \quad (1)$$

where $V_{out}$ is the output voltage Vout; $V_{ref2}$ is the second reference voltage Vref2, $C_1$ is capacitance of the capacitor C1, and $C_{load}$ is capacitance of the load 370.

Figure 5:
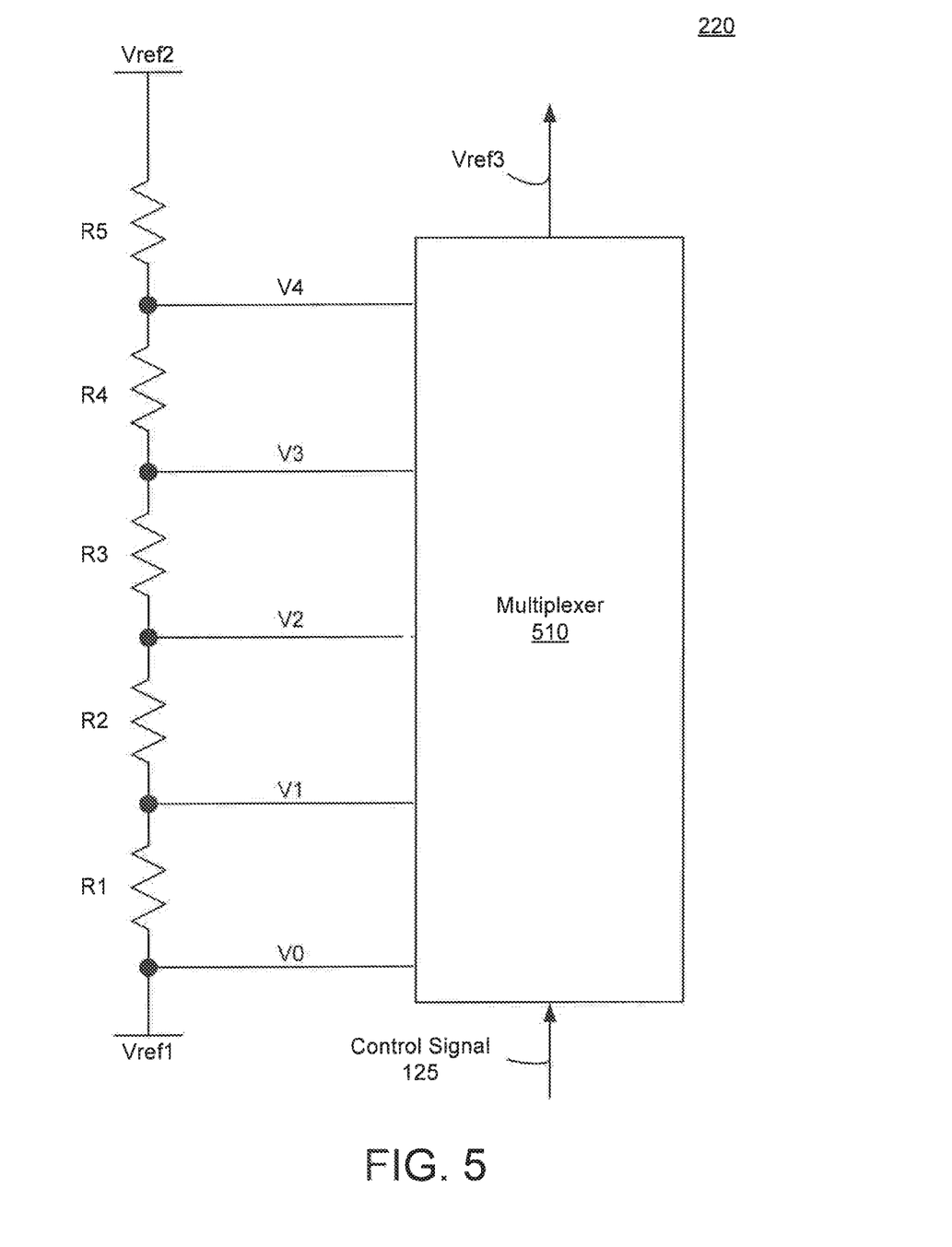
FIG. 5 is a diagram depicting example reconfigurable reference voltage generator circuitry of the example pulse amplifier shown in FIG. 2, according to one or more embodiments.

Referring to FIG. 5, illustrated is a diagram depicting example reconfigurable reference voltage generator circuitry 220, according to one or more embodiments. In one aspect, the reconfigurable reference voltage generator circuitry 220 is powered by the first reference Vref1 and the second reference voltage Vref2. In this configuration, the reconfigurable reference voltage generator circuitry 220 receives a control signal 125 indicating a target reference voltage to be output, and generates the third reference voltage Vref3 between the first reference voltage Vref1 and the second reference voltage Vref2, according to the control signal 125. In other embodiments, the reconfigurable reference voltage generator circuitry 220 includes more, fewer, or different components than shown in FIG. 5.

In some embodiments, the reconfigurable reference voltage generator circuitry 220 includes a resistor ladder (e.g., resistors R1, R2, R3, R4, R5), and a multiplexer 510 that together form a resistor ladder digital-to-analog (DAC) structure. In one implementation, the resistors R1, R2, R3, R4, R5 of the resistor ladder are connected in series between, for example, a sink voltage rail through which the first reference voltage Vref1 is supplied and a supply voltage rail through which the second reference voltage Vref2 is supplied. In this configuration, the resistor ladder generates different voltages (e.g., voltages V0, V1, V2, V3, V4) between the first reference voltage Vref1 and the second reference voltage Vref2. In one implementation, the multiplexer 510 is coupled to the resistor ladder. In this configuration, the multiplexer 510 receives the voltages (e.g., voltages V1, V2, V3, V4) from the resistor ladder, selects one of the received voltages that is close to or near the target voltage indicated by the control signal 125, and outputs the selected voltage as the reference voltage Vref3. For example, the reconfigurable reference voltage generator circuitry 220 generates 0V, 0.05V, 0.1V, 0.15V, 0.2V, 0.25V, 0.3V, and 0.35, each corresponds to one of a control signal represented in a digital representation '000', '001', '010', '011', '100', '101', '110'. and '111', respectively. Other voltage values and/or corresponding digital representations are possible. The reconfigurable reference voltage generator circuitry 220 selects a voltage corresponding to the control signal 125, and outputs the selected voltage as the reference voltage Vref3.

Figure 6:
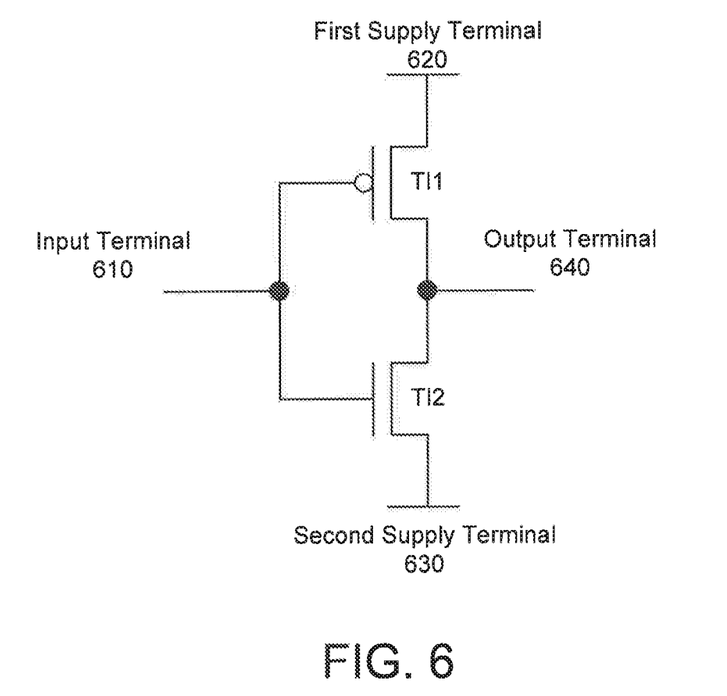
FIG. 6 is a diagram depicting example driver circuitry, according to one or more embodiments.

Referring to FIG. 6, illustrated is a diagram depicting example driver circuitry I4, according to one or more embodiments, In some embodiments, the driver circuitry I4 includes transistors TI1, TI2. In one implementation, the transistor TI1 is a P-type transistor (e.g., PMOS transistor), and the transistor TI2 is an N-type transistor (e.g., NMOS transistor). In one configuration, the transistors TI1, TI2 form an inverter structure, except the driver circuitry I4 is powered by the second reference voltage Vref2 received at a first supply terminal 620 and the third reference voltage Vref3 received at a second supply terminal 630. In some embodiments, the driver circuitry I4 includes an input terminal 610 coupled to a gate electrode of the P-type transistor TI1 and a gate electrode of the N-type transistor TI2; the first supply terminal 620 coupled to a first electrode (e.g., source electrode) of the transistor TI1: the second supply terminal 630 coupled to a first electrode (e.g., source electrode) of the transistor TI2; and/or an output terminal 640 coupled to a second electrode (e.g., drain electrode) of the transistor TI1 and a second electrode (e.g., drain electrode) of the transistor TI2. In this configuration, in response to the second reference voltage Vref2 (e.g., supply voltage or VDD) applied at the input terminal 610, the transistor TI2 couples the output terminal 640 to the second supply terminal 630 and the transistor TI1 decouples the output terminal 640 from the first supply terminal 620, such that the voltage of the output terminal 640 becomes the third reference voltage Vref3 supplied at the second supply terminal 630. Similarly, in response to the first reference voltage Vref1 (e.g., ground voltage or 0V) at the input terminal 610, the transistor TI2 decouples the output terminal 640 from the second supply terminal 630 and the transistor TI1 couples the output terminal 640 to the first supply terminal 620, such that the voltage of the output terminal 640 becomes the second reference voltage Vref2 supplied at the first supply terminal 620. Accordingly, the driver circuitry I4 receives a clock pulse 115 swinging or transitioning between the first reference voltage Vref1 and the second reference voltage Vref2 at the input terminal 610, and generates the driving pulse 345 swinging or transitioning between the third reference voltage Vref3 and the second reference voltage Vref2 at the output terminal 640.

Figure 7:
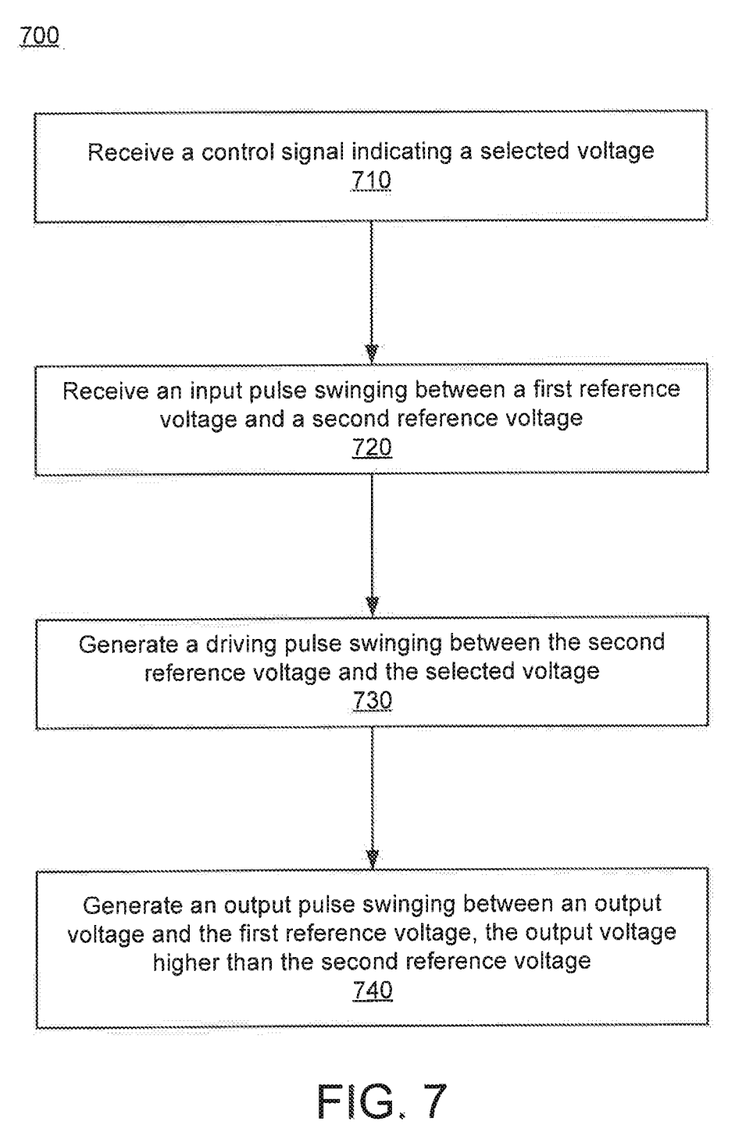
FIG. 7 is an example flowchart illustrating a process of amplifying amplitude of a pulse, according to one or more embodiments.

Referring to FIG. 7, illustrated is an example flowchart describing a process 700 of amplifying amplitude of a pulse, according to one or more embodiments. In some embodiments, the process 700 is performed by the pulse amplifier 130 of FIG. 2. In other embodiments, the process 700 is performed by other entities. In some embodiments, the process 700 includes more, fewer, or different steps than shown in FIG. 7. In other embodiments, the steps are performed in a different order. For example, the steps 710, 720 may be performed in a different order than shown in FIG. 7, or performed simultaneously.

In some embodiments, the pulse amplifier 130 receives 710 a control signal (e.g., control signal 125) indicating a selected voltage (e.g., third reference voltage Vref3) between the first reference voltage Vref1 and the second reference voltage Vref2. In one aspect, the control signal indicates a target voltage of an output pulse (e.g., amplified pulse 135) or target amplitude of the output pulse. In some embodiments, the pulse amplifier 130 receives the control signal, for example, from the controller 120, from external circuitry, or from any device.

In some embodiments, the pulse amplifier 130 receives 720 an input pulse (e.g., a clock pulse 115) swinging between a first reference voltage Vref1 (e.g., ground voltage or 0V) and a second reference voltage Vref2 (e.g., supply voltage or VDD). In some embodiments, the pulse amplifier 130 receives the input pulse, for example, from the clock generator 110, from external circuitry, or from any device.

In some embodiments, the pulse amplifier 130 generates 730 or outputs a driving pulse (e.g., driving pulse 345) swinging between the second reference voltage Vref2 (e.g., supply voltage or VDD) and the selected voltage indicated by the control signal. In some embodiments, the pulse amplifier 130 generates the driving pulse that is synchronized or delayed from the input pulse. In some embodiments, the pulse amplifier 130 generates the driving pulse having reduced amplitude than the input pulse according to the control signal.

In some embodiments, the pulse amplifier 130 generates 740 or outputs the output pulse (e.g., amplified pulse 135) swinging between an output voltage and the first reference voltage Vref1 (e.g., ground voltage or 0V), according to the driving pulse, In some embodiments, the output voltage is higher than the second reference voltage Vref2 (e.g., supply voltage or VDD). In one aspect, the selected voltage enables the amplitude (e.g., a difference between the first reference voltage and the output voltage) of the output pulse to be higher than an overstress voltage of a transistor in the pulse amplifier 130 without damaging the transistor.

Although various embodiments of increasing amplitude of a clock pulse are disclosed herein, in other embodiments, disclosed embodiments are applicable to any system or device for increasing amplitude of any pulse. Although the pulse amplifier 130 disclosed in FIG. 1 is described as being applied to the sampling device 140, in other embodiments, the pulse amplifier 130 is applicable to any system or device that employs pulses (e.g., communication devices, display devices, memory devices, etc.). Although transistors implemented in various circuitries or devices disclosed herein are described as being MOSFET, in other embodiments, other types of transistors (e.g., BJT, etc.) are implemented.

While the foregoing written description of the methods and systems enables one of ordinary skill to make and use various embodiments of these methods and systems, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

We claim:

1. A device comprising:
   driver circuitry configured to:
      receive an input pulse swinging between a first reference voltage and a second reference voltage higher than the first reference voltage, and
      generate a driving pulse swinging between a third reference voltage and the second reference voltage according to the input pulse, the third reference voltage between the first reference voltage and the second reference voltage; and
   a first transistor coupled to the driver circuitry, the first transistor having a first electrode and a second electrode, the first electrode coupled to a supply voltage rail configured to supply the second reference voltage, the first transistor configured to output, at the second electrode, an output pulse swinging between the first reference voltage and an output voltage according to the driving pulse from the driver circuitry, the output voltage higher than the second reference voltage.

2. The device of claim 1, wherein the output voltage is less than a sum of the third reference voltage and an overstress voltage of the first transistor.

3. The device of claim 1, further comprising:
   reconfigurable reference voltage generator circuitry coupled to the driver circuitry, the reconfigurable reference voltage generator circuitry configured to output a selected one of a predetermined number of reference voltages as the third reference voltage to the driver circuitry.

4. The device of claim 3, wherein the driver circuitry includes:
an input terminal to receive the input pulse,
an output terminal to output the driving pulse,
a first supply terminal to receive the second reference voltage,
a second supply terminal coupled to an output terminal of the reconfigurable reference voltage generator circuitry, the second supply terminal to receive the third reference voltage,
an N-type transistor coupled between the second supply terminal and the output terminal of the driver circuitry, and
a P-type transistor coupled between the first supply terminal and the output terminal of the driver circuitry, the N-type transistor and the P-type transistor configured to receive the input pulse and generate the driving pulse according to the input pulse, the second reference voltage, and the third reference voltage.

5. The device of claim 1, wherein the first transistor includes:
the first electrode to receive a source pulse swinging between the second reference voltage and the output voltage,
a gate electrode coupled to the driver circuitry to receive the driving pulse, and
the second electrode to output the output pulse according to the source pulse received at the first electrode of the first transistor and the driving pulse received at the gate electrode of the first transistor.

6. The device of claim 5, further comprising:
a second transistor including:
a first electrode to receive a sink pulse swinging between the first reference voltage and the second reference voltage,
a gate electrode to receive the second reference voltage, while the first electrode of the second transistor receives the sink pulse, and
a second electrode coupled to the second electrode of the first transistor.

7. The device of claim 6, wherein the second transistor is configured to:
electrically couple the first electrode of the second transistor to the second electrode of the first transistor, in response to the first reference voltage of the sink pulse received at the first electrode of the second transistor, to generate the first reference voltage of the output pulse, and
electrically decouple the first electrode of the second transistor from the second electrode of the first transistor, in response to the second reference voltage of the sink pulse received at the first electrode of the second transistor, to generate the output voltage of the output pulse.

8. The device of claim 6, further comprising:
cascaded inverters, an output of the cascaded inverters coupled to the first electrode of the second transistor, the cascaded inverters configured to generate the sink pulse according to the input pulse, the cascaded inverters operating according to the first reference voltage and the second reference voltage.

9. The device of claim 6, further comprising:
a capacitor; and
a third transistor including:
a first electrode coupled to the supply voltage rail, at which the second reference voltage is supplied,
a gate electrode coupled to a first electrode of the capacitor, the gate electrode of the third transistor to receive a charging pulse swinging between the first reference voltage and the second reference voltage, and
a second electrode coupled to the first electrode of the first transistor and a second electrode of the capacitor.

10. The device of claim 9, wherein the third transistor is configured to:
electrically couple the supply voltage rail to the first electrode of the first transistor, in response to the first reference voltage of the charging pulse received at the gate electrode of the third transistor to generate the second reference voltage of the source pulse, and
electrically decouple the supply voltage rail from the first electrode of the first transistor, in response to the second reference voltage of the charging pulse received at the gate electrode of the third transistor, to generate the output voltage of the source pulse higher than the second reference voltage.

11. The device of claim 9, wherein the first transistor is configured to:
electrically couple the second electrode of the second transistor to the second electrode of the third transistor, in response to the third reference voltage of the driving pulse received at the gate electrode of the first transistor to generate the output voltage of the output pulse, and
electrically decouple the second electrode of the second transistor from the second electrode of the third transistor, in response to the second reference voltage of the driving pulse received at the gate electrode of the first transistor to generate the first reference voltage of the output pulse.

12. The device of claim 9, further comprising:
cascaded inverters, an output of the cascaded inverters coupled to the gate electrode of the third transistor, the cascaded inverters configured to generate the charging pulse according to the input pulse, the cascaded inverters operating according to the first reference voltage and the second reference voltage.

13. The device of claim 12, further comprising:
additional cascaded inverters, an output of the additional cascaded inverters coupled to the first electrode of the second transistor, the additional cascaded inverters configured to generate the sink pulse according to the input pulse, the additional cascaded inverters operating according to the first reference voltage and the second reference voltage, the cascaded inverters and the additional cascaded inverters sharing at least one inverter.

14. A system comprising:
an adjustable driving pulse generator configured to:
receive an input pulse swinging between a first reference voltage and a second reference voltage higher than the first reference voltage, and
generate a driving pulse swinging between a third reference voltage and the second reference voltage according to the input pulse, the third reference voltage between the first reference voltage and the second reference voltage, the third reference voltage selected from a plurality of predetermined voltages according to a control signal; and
a first transistor coupled to the adjustable driving pulse generator, the first transistor configured to output an output pulse swinging between the first reference voltage and an output voltage according to the driving pulse from the adjustable driving pulse generator, the output voltage higher than the second reference voltage.

15. The system of claim 14, wherein the output voltage is less than a sum of the third reference voltage and an overstress voltage of the first transistor.

16. The system of claim 14, wherein the adjustable driving pulse generator includes:
reconfigurable reference voltage generator circuitry configured to output a selected one of the plurality of predetermined voltages as the third reference voltage according to the control signal, and
driver circuitry having:
an input terminal to receive the input pulse,
an output terminal to output the driving pulse,
a first supply terminal to receive the second reference voltage,
a second supply terminal coupled to an output terminal of the reconfigurable reference voltage generator circuitry, the second supply terminal to receive the third reference voltage,
an N-type transistor coupled between the second supply terminal and the output terminal of the driver circuitry, and
a P-type transistor coupled between the first supply terminal and the output terminal of the driver circuitry, the N-type transistor and the P-type transistor configured to receive the input pulse and generate the driving pulse according to the input pulse, the second reference voltage and the third reference voltage.

17. The system of claim 14, wherein the first transistor includes:
a first electrode to receive a source pulse swinging between the second reference voltage and the output voltage,
a gate electrode coupled to the adjustable driving pulse generator to receive the driving pulse, and
a second electrode to output the output pulse according to the source pulse received at the first electrode of the first transistor and the driving pulse received at the gate electrode of the first transistor.

18. The system of claim 17, further comprising:
a second transistor including:
a first electrode to receive a sink pulse swinging between the first reference voltage and the second reference voltage,
a gate electrode to receive the second reference voltage, while the first electrode of the second transistor receives the sink pulse, and
a second electrode coupled to the second electrode of the first transistor, the second transistor is configured to:
electrically couple the first electrode of the second transistor to the second electrode of the first transistor, in response to the first reference voltage of the sink pulse received at the first electrode of the second transistor, to generate the first reference voltage of the output pulse; and
electrically decouple the first electrode of the second transistor from the second electrode of the first transistor, in response to the second reference voltage of the sink pulse received at the first electrode of the second transistor, to generate the output voltage of the output pulse.

19. The system of claim 18, further comprising:
a capacitor; and
a third transistor including:
a first electrode coupled to a supply voltage rail, at which the second reference voltage is supplied,
a gate electrode coupled to a first electrode of the capacitor, the gate electrode of the third transistor to receive a charging pulse swinging between the first reference voltage and the second reference voltage, and
a second electrode coupled to the first electrode of the first transistor and a second electrode of the capacitor, the third transistor is configured to:
electrically couple the supply voltage rail to the first electrode of the first transistor, in response to the first reference voltage of the charging pulse received at the gate electrode of the third transistor to generate the second reference voltage of the source pulse; and
electrically decouple the supply voltage rail from the first electrode of the first transistor, in response to the second reference voltage of the charging pulse received at the gate electrode of the third transistor, to generate the output voltage of the source pulse.

20. A method comprising:
receiving a clock pulse swinging between a first reference voltage and a second reference voltage higher than the first reference voltage;
receiving a control signal indicating a selected voltage from a plurality of voltages;
generating a driving pulse swinging between the second reference voltage and the selected voltage indicated by the control signal according to the clock pulse, the selected voltage between the first reference voltage and the second reference voltage; and
generating, by a transistor, an output pulse swinging between an output voltage and the first reference voltage, according to the driving pulse, the output voltage higher than the second reference voltage, the output voltage less than a sum of the selected voltage and an overstress voltage of the transistor.

* * * * *